United States Patent
Sasa et al.

(10) Patent No.: US 12,455,513 B2
(45) Date of Patent: Oct. 28, 2025

(54) CHEMICAL LIQUID CIRCULATION APPARATUS, CHEMICAL LIQUID DISPENSING APPARATUS, AND CHEMICAL LIQUID SUPPLY SYSTEM HAVING THE SAME

(71) Applicant: SAMSUNG ELECTRONICS CO., LTD., Suwon-si (KR)

(72) Inventors: Takashi Sasa, Hwaseong-si (KR); Kyoungwhan Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 597 days.

(21) Appl. No.: 17/465,605

(22) Filed: Sep. 2, 2021

(65) Prior Publication Data

US 2022/0187721 A1 Jun. 16, 2022

(30) Foreign Application Priority Data

Dec. 14, 2020 (KR) .................. 10-2020-0174227

(51) Int. Cl.
*G03F 7/00* (2006.01)
*B05C 11/10* (2006.01)
(Continued)

(52) U.S. Cl.
CPC .......... *G03F 7/70925* (2013.01); *B08B 9/023* (2013.01); *B08B 9/0321* (2013.01);
(Continued)

(58) Field of Classification Search
USPC .......... 118/52, 612, 319, 410, 302, 602, 610
See application file for complete search history.

(56) References Cited

U.S. PATENT DOCUMENTS 5,954,078 A * 9/1999 Chiang ............. H01L 21/67075
222/64
10,074,547 B2 9/2018 Tseng et al.
(Continued)

FOREIGN PATENT DOCUMENTS

CN 108016038 A * 5/2018
JP 2004271455 A * 9/2004
(Continued)

OTHER PUBLICATIONS

English Translation JP673421B2 (Year: 2020).*
(Continued)

*Primary Examiner* — Yewebdar T Tadesse
(74) *Attorney, Agent, or Firm* — Wolf, Greenfield & Sacks, P.C.

(57) ABSTRACT

A chemical liquid supply system includes a chemical liquid tank including an inlet allowing a chemical fluid to be introduced therethrough, an opening allowing the chemical liquid introduced through the inlet to be temporarily stored, and an outlet allowing the chemical liquid stored in the opening to flow out therethrough, a chemical liquid circulation apparatus including a supply flow path supplying the chemical liquid to the inlet and a recovery flow path resupplying the chemical liquid collected from the outlet to the supply flow path, a chemical liquid supply source supplying the chemical liquid to the supply flow path of the chemical liquid circulation apparatus, and a chemical liquid dispensing apparatus configured to move to the opening and draw the chemical liquid from the opening, move to a substrate to be treated and discharge the chemical liquid onto the substrate.

20 Claims, 16 Drawing Sheets

(51) Int. Cl.
*B08B 9/023* (2006.01)
*B08B 9/032* (2006.01)
*H01L 21/67* (2006.01)

(52) U.S. Cl.
CPC ...... *B08B 9/0328* (2013.01); *H01L 21/67051* (2013.01); *B08B 2209/032* (2013.01)

(56) References Cited

U.S. PATENT DOCUMENTS

| | | |
|---|---|---|
| 2004/0144736 A1 | 7/2004 | Yajima |
| 2007/0082499 A1 | 4/2007 | Jung et al. |
| 2010/0093183 A1 | 4/2010 | Kim et al. |
| 2013/0068324 A1* | 3/2013 | Furusho .................. B05C 11/10 137/544 |
| 2019/0317408 A1 | 10/2019 | Goo et al. |

FOREIGN PATENT DOCUMENTS

| | | | | |
|---|---|---|---|---|
| JP | 6734621 B2 * | 8/2020 | .......... | B01F 15/0022 |
| KR | 20040060851 A | 7/2004 | | |
| KR | 100497276 B1 | 7/2005 | | |
| KR | 20060010316 A | 2/2006 | | |
| KR | 101452608 B1 * | 10/2014 | | |

OTHER PUBLICATIONS

English Translation CN 108016038A (Year: 2018).*
English Translation KR-101452608-B1 (Year: 2014).*
English Translation JP 2004271455A (Year: 2004).*
"Request for the Submission of an Opinion" with English Machine Translation, KR Application No. 10-2020-0174227, Jan. 9, 2025, 12 pp.

* cited by examiner

CHEMICAL LIQUID CIRCULATION APPARATUS, CHEMICAL LIQUID DISPENSING APPARATUS, AND CHEMICAL LIQUID SUPPLY SYSTEM HAVING THE SAME

CROSS-REFERENCE TO RELATED APPLICATION(S)

This application claims benefit of priority to Korean Patent Application No. 10-2020-0174227 filed on Dec. 14, 2020 in the Korean Intellectual Property Office, the disclosure of which is incorporated herein by reference in its entirety.

BACKGROUND

The present inventive concept relates to a chemical liquid circulation apparatus, a chemical liquid dispensing apparatus, and a chemical liquid supply system including the same.

Recently, a lithography process using extreme ultraviolet light has been proposed for micromachining of semiconductor devices. In an extreme ultraviolet lithography process, a circuit pattern having an ultra-fine line width may be formed. In order to form a circuit pattern having such an ultra-fine line width, a chemical liquid applied to a wafer should have a very small amount of particles. Unfortunately, a conventional chemical liquid supply apparatus may not be able to limit the amount of particles in a chemical liquid supplied therethrough.

SUMMARY

An aspect of the present inventive concept is to provide a chemical liquid circulation apparatus capable of supplying a chemical liquid having high cleanliness, a chemical liquid dispensing apparatus, and a chemical liquid supply system using the same.

According to an aspect of the present inventive concept, a chemical liquid supply system includes: a chemical liquid tank including an inlet, an opening allowing a chemical liquid introduced through the inlet to be temporarily stored, and an outlet; a chemical liquid circulation apparatus including a supply flow path configured to supply the chemical liquid to the inlet of the chemical liquid tank and a recovery flow path configured to resupply the chemical liquid collected from the outlet of the chemical liquid tank to the supply flow path; a chemical liquid supply source configured to supply the chemical liquid to the supply flow path; and a chemical liquid dispensing apparatus configured to move to the opening of the chemical liquid tank, draw the chemical liquid from the opening, move to a substrate to be treated, and discharge the drawn chemical liquid onto the substrate.

According to an aspect of the present inventive concept, a chemical liquid circulation apparatus includes: a supply flow path configured to supply a chemical liquid to an external device, and a recovery flow path configured to collect the chemical liquid from the external device and to resupply the collected chemical to the supply flow path, wherein the supply flow path includes a circulation pump configured to pump the chemical liquid, a filter disposed at a rear end of the circulation pump and configured to filter out particles from the chemical liquid, and a chemical liquid storage unit in fluid communication with the supply flow path and the recovery flow path.

According to an aspect of the present inventive concept, a chemical liquid dispensing apparatus includes: an arm; a syringe portion connected to the arm, the syringe portion having an internal space; a syringe pump disposed in the internal space and configured to adjust a pressure of the internal space; a nozzle portion in fluid communication with the syringe portion and configured to draw a liquid therein and discharge the liquid therefrom in response to operation of the syringe pump, wherein the nozzle portion comprises light-transmissive material; and a cleaning liquid valve unit in fluid communication with the syringe portion and configured to supply a cleaning liquid to the internal space.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments of the present inventive concept will be described in detail with reference to the accompanying drawings.

Figure 1:
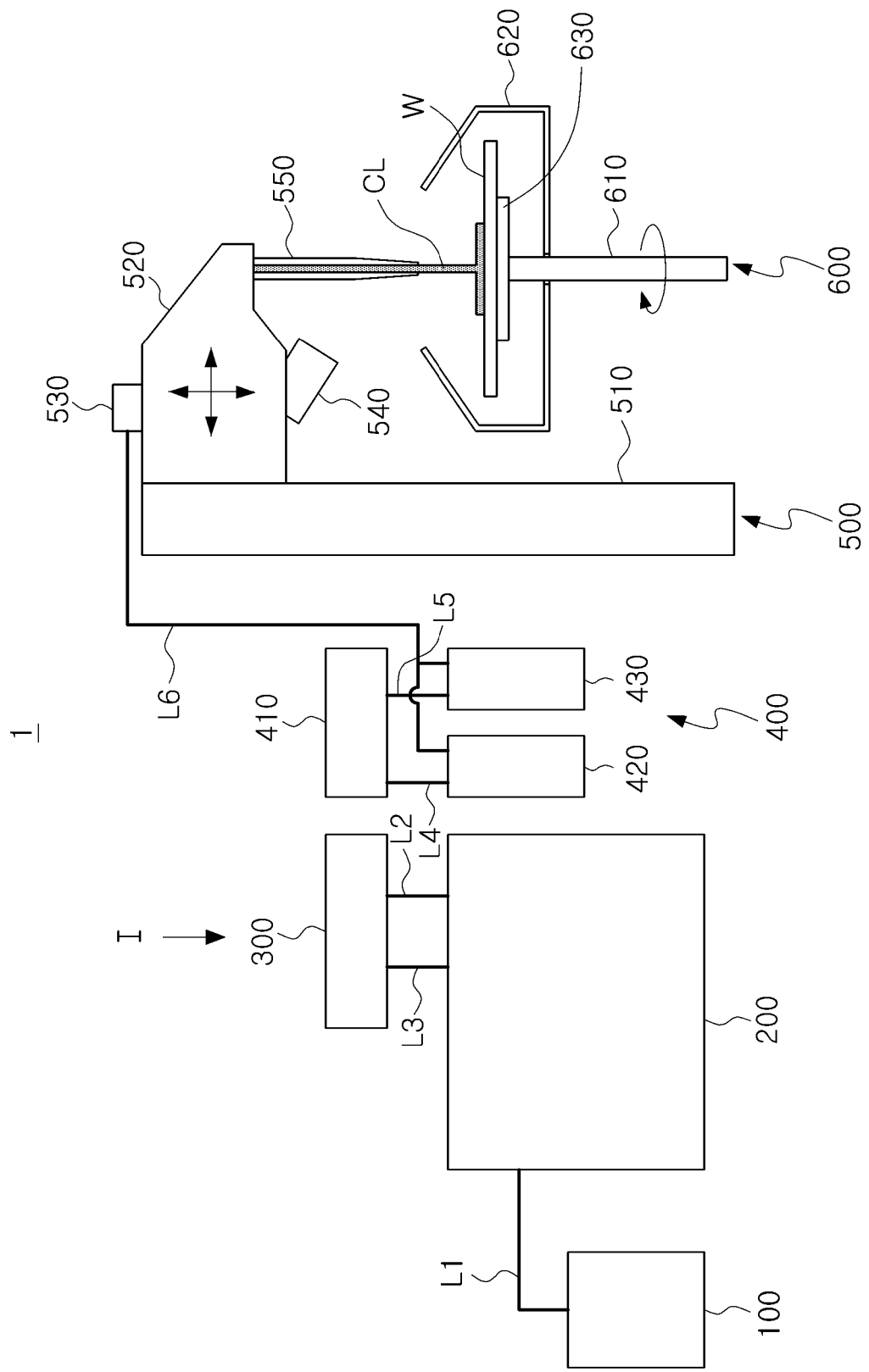
FIG. 1 is a side view of a chemical liquid supply system according to an embodiment of the present inventive concept.
Figure 2:
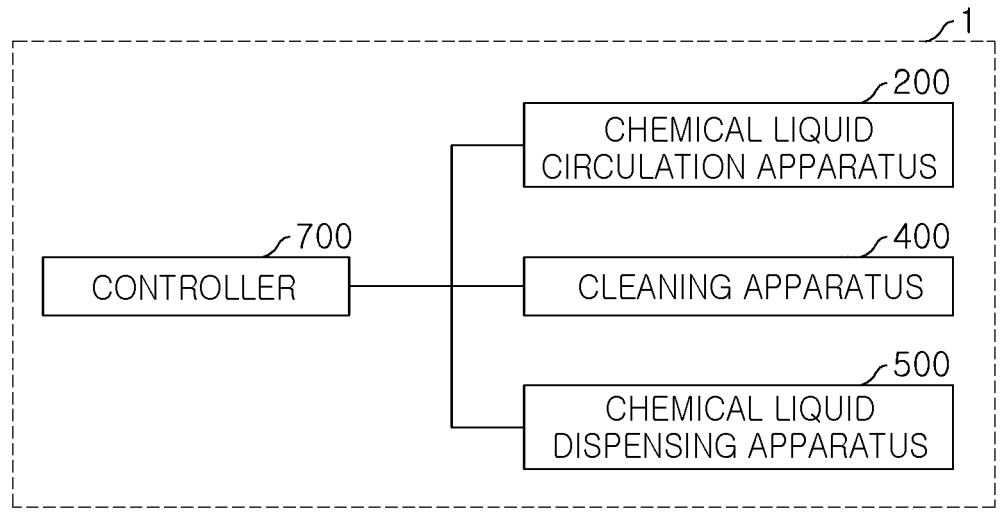
FIG. 2 is a block diagram of the chemical liquid supply system of FIG. 1.

A chemical liquid supply system according to an embodiment of the present inventive concept will be described with reference to FIGS. 1 and 2. FIG. 1 is a side view of a chemical liquid supply system according to an embodiment of the present inventive concept, and FIG. 2 is a block diagram of a chemical liquid supply system of FIG. 1.

Referring to FIG. 1, a chemical liquid supply system 1 according to an embodiment of the present inventive concept may include a chemical liquid circulation apparatus 200, a chemical liquid tank 300, a chemical liquid dispensing apparatus 500, and a cleaning apparatus 400. In FIG. 1, one chemical liquid circulation apparatus 200, one chemical liquid tank 300, one chemical liquid dispensing apparatus 500, and one cleaning apparatus 400 are illustrated, but the number of the chemical liquid circulation apparatus 200, the chemical liquid tank 300, the chemical liquid dispensing apparatus 500, and the cleaning apparatus 400 constituting one chemical liquid supply system 1 may be variously modified. For example, in the chemical liquid supply system 1, a plurality of chemical liquid circulation apparatuses 200 and a plurality of chemical liquid dispensing apparatuses 500 may be disposed in one chemical liquid tank 300. In addition, in the chemical liquid supply system 1, a plurality of chemical liquid circulation apparatuses 200 and a plurality of chemical liquid dispensing apparatuses 500 may be disposed in a plurality of chemical liquid tanks 300, respectively.

In the chemical liquid supply system 1 according to an embodiment of the present inventive concept, a chemical liquid supplied from a chemical liquid supply source 100 is continuously circulated in the chemical liquid circulation apparatus 200 and supplied to the chemical liquid tank 300. The chemical liquid supplied to the chemical liquid tank 300 may be suctioned through the chemical liquid dispensing apparatus 500 and discharged to a wafer W. In addition, the chemical liquid dispensing apparatus 500 may be cleaned and dried in the cleaning apparatus 400.

An embodiment in which the chemical liquid supply system 1 is applied to a spin coating apparatus 600 applying a chemical liquid CL to the wafer W, a substrate to be treated, will be described as an example. The spin coating apparatus 600 is an apparatus that rotates the wafer W, a substrate to be treated, disposed on a chuck 630 at a high speed through a rotational shaft 610, and a bowl 620 may be disposed around the chuck 630 to prevent the chemical liquid CL from spilling. In addition, the chemical liquid supply system 1 of an embodiment may be applied to various devices and facilities for applying a chemical liquid. In addition, in an embodiment, a case in which the chemical liquid supplied from the chemical liquid supply system 1 is a photoresist is described as an example, but the present inventive concept is not limited thereto and various types of chemical liquids such as a cleaning liquid may be used.

Referring to FIG. 2, the chemical liquid circulation apparatus 200, the cleaning apparatus 400, and the chemical liquid dispensing apparatus 500 included in the chemical liquid supply system 1 of an embodiment may be controlled by a controller 700.

Figure 3:
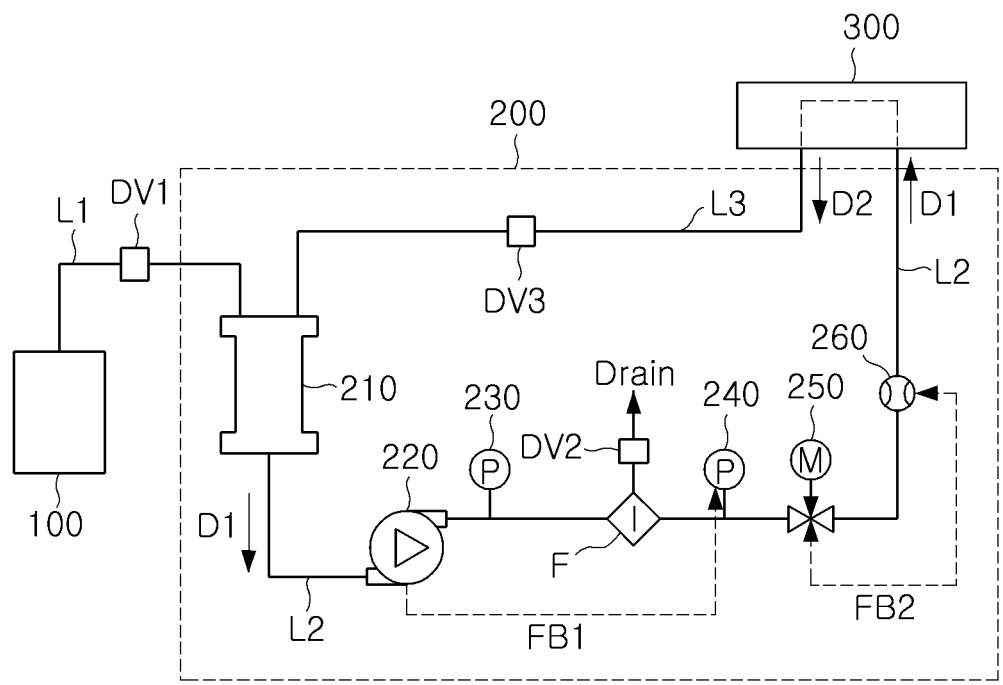
FIG. 3 is a block diagram of the chemical liquid circulation apparatus of FIG. 1.

Referring to FIG. 3, the chemical liquid circulation apparatus 200 may allow a chemical liquid supplied through a first flow path L1 from the chemical liquid supply source 100 to flow in one direction D1 and be supplied to the chemical liquid tank 300 through a second flow path L2, referred to as a supply flow path. In addition, a chemical liquid flowing out of the chemical liquid tank 300 may be recovered through a third flow path L3, referred to as a recovery flow path, and may be resupplied to the first flow path L1. Accordingly, the chemical liquid circulation apparatus 200 according to an embodiment may form a circulation flow path with the chemical liquid tank 300 to circulate the supplied chemical liquid.

A chemical liquid storage unit 210 may be disposed between the second flow path L2 and the third flow path L3 to temporarily store the chemical liquid supplied from the chemical liquid supply source 100. Therefore, even if the chemical liquid supply source 100 is separated from the first flow path L1 to replace the chemical liquid supply source 100, a flow rate of the chemical liquid supplied through the second flow path L2 may be maintained to be constant for a predetermined time. In an embodiment, the chemical liquid storage unit 210 may be a trap tank.

A circulation pump 220 for pressurizing the chemical liquid may be disposed in the second flow path L2. In an embodiment, the circulation pump 220 may be a magnetic levitation pump. A filter F filtering the chemical liquid flowing through the second flow path L2 may be disposed at a rear end of the circulation pump 220. Particles filtered by the filter F may be discharged through a drain flow path Drain.

First and second pressure sensors 230 and 240 measuring hydraulic pressure may be disposed at front and rear ends of the filter F, respectively. The second pressure sensor 240 and the circulation pump 220 may be feedback-controlled with each other (FB1). A motor needle valve 250 and a flow meter 260 adjusting a flow rate of the chemical liquid may be disposed at a rear end of the filter F, and the motor needle valve 250 and the flow meter 260 may be feedback-controlled with each other (FB2). Valves DV1 to DV3 for maintenance of the flow path may be disposed in the first and third flow paths L1 and L3 and the drain flow path Drain.

Since the chemical liquid circulation apparatus 200 of an embodiment is separated from the chemical liquid dispensing apparatus 500, the chemical liquid may be constantly circulated at a constant pressure, regardless of operation of the chemical liquid dispensing apparatus 500. Therefore, the chemical liquid circulation apparatus 200 of an embodiment may circulate the chemical liquid even when the chemical liquid dispensing apparatus 500 does not operate, and thus, the chemical liquid supplied from the chemical liquid supply source 100 may be prevented from stagnating and agglomerating (i.e., clumping). In particular, in the case of a photoresist, a stagnant flow thereof may tend to cause polymers contained therein to be bonded to each other to cause particles. Since the chemical liquid circulation apparatus 200 of an embodiment continuously circulates the chemical liquid, it is possible to prevent particles from occurring in the chemical liquid.

Figure 15:
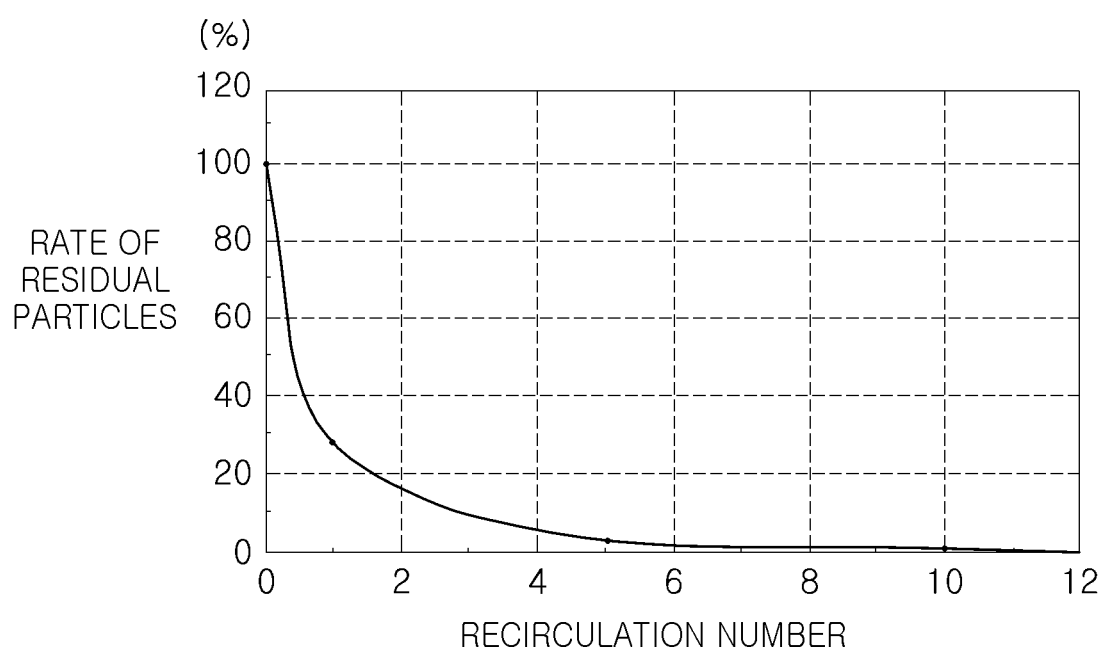
FIG. 15 is a graph illustrating an effect of reducing particles in a chemical liquid by the chemical liquid circulation apparatus of FIG. 1.

In addition, since the chemical liquid circulation apparatus 200 according to an embodiment repeatedly filters the chemical liquid through continuous circulation, cleanliness of the chemical liquid may be remarkably improved. This will be described with reference to FIG. 15. FIG. 15 is a graph illustrating a correlation between the number of re-circulations of the chemical liquid and a rate of residual particles of the chemical liquid. Referring to FIG. 15, it can be seen that the rate of residual particles decreases to 28% when the chemical liquid is filtered once, decreases to 3% when the chemical liquid is filtered five times, and decreases to 1% or less when the chemical liquid is filtered ten times or more. In a conventional chemical liquid circulation apparatus, a flow of a chemical liquid typically occurs only when the chemical liquid is dispensed and is filtered, thereby making it difficult to filter more than once before the chemical liquid is dispensed. Meanwhile, in the case of the chemical liquid circulation apparatus 200 according to an embodiment, the chemical liquid may be continuously circulated and filtered regardless of whether the chemical liquid is dispensed. Accordingly, the chemical liquid circulation apparatus 200 according to an embodiment may significantly reduce the rate of residual particles remaining in the chemical liquid. That is, the chemical liquid circulation apparatus 200 according to an embodiment may dramatically improve cleanliness of the chemical liquid by filtering the chemical liquid multiple times.

In addition, since a conventional chemical liquid supply apparatus repeat supply and stagnation of the chemical liquid, a flow velocity of the chemical liquid is typically maintained within a range of about 0.33 ml/sec to 1.0 ml/sec. In comparison, the chemical liquid circulation apparatus 200 according to an embodiment continuously circulates the chemical liquid, and thus, a circulation speed of the chemical liquid may be maintained to be very low compared to the existing chemical liquid supply apparatus. That is, in the chemical liquid circulation apparatus 200 of an embodiment, the flow velocity of the chemical liquid may be lowered to about 0.01 ml/sec to 0.05 ml/sec. An increase in flow velocity of the chemical liquid increases occurrence of bubbles in the flow path. In the chemical liquid circulation apparatus 200 of an embodiment, since the chemical liquid is continuously circulated and supplied at a low flow velocity, occurrence of bubbles in the flow path may be effectively reduced.

In addition, in a conventional chemical liquid supply apparatus, circulation and stagnation of the chemical liquid is typically repeated by a pump and a valve. As such, hydraulic pressure of the supplied chemical liquid may vibrate unstably. In contrast, in the case of an embodiment, hydraulic pressure of the chemical liquid supplied by the circulation pump 220 may be maintained constant.

Figure 16A:
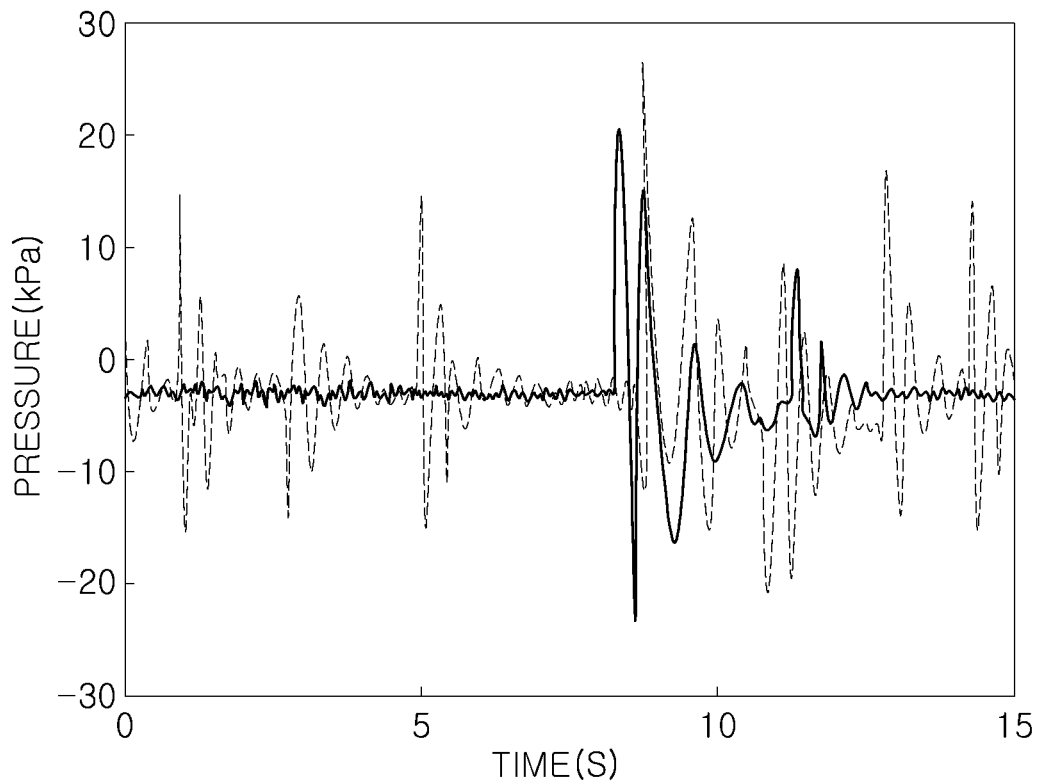
FIG. 16A is a chemical liquid pressure graph of a chemical liquid circulation apparatus of a Comparative Example.
Figure 16B:
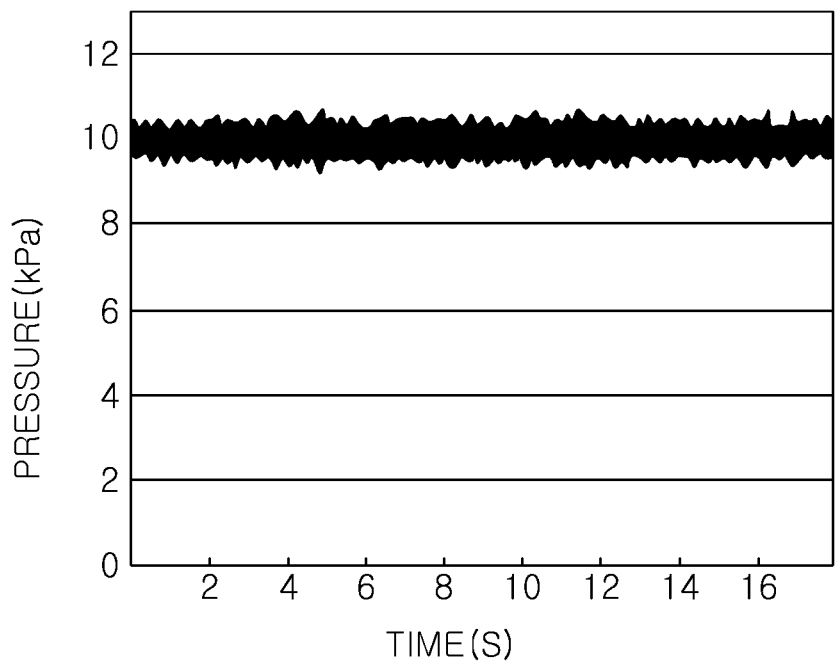
FIG. 16B is a chemical liquid pressure graph of a chemical liquid circulation apparatus according to an embodiment of the present inventive concept.

This will be described with reference to FIGS. 16A and 16B. FIG. 16A is a graph of chemical liquid pressure of the chemical liquid circulation apparatus according to a comparative example, and FIG. 16B is a graph of chemical liquid pressure of the chemical liquid circulation apparatus according to an embodiment of the present inventive concept. Referring to FIG. 16A, in the case of the comparative example, it can be seen that a strong pulsation in which pressure of the chemical liquid vibrates between −13 kPa to 18 kPa is measured. Referring to FIG. 16B, in the case of an embodiment, it can be seen that only weak pulsations within the range not exceeding ±5% at 10 kPa are measured in the pressure of the chemical liquid.

In addition, in a conventional chemical liquid supply apparatus, a pump and valve operate so as to cause the chemical liquid to cycle between circulation and stagnation. This may increase the occurrence of bubbles in the flow path. Moreover, particles in the chemical liquid may also increase due to particles that come off the pump and the valve during the process of opening and closing the pump and the valve. In contrast, in the chemical liquid circulation apparatus 200 of an embodiment of the present inventive concept, since the chemical liquid is continuously circulated, the operation of the pump and the valve is minimized, and thus, the occurrence of bubbles and/or particles in the chemical liquid may be effectively reduced.

Figure 4:
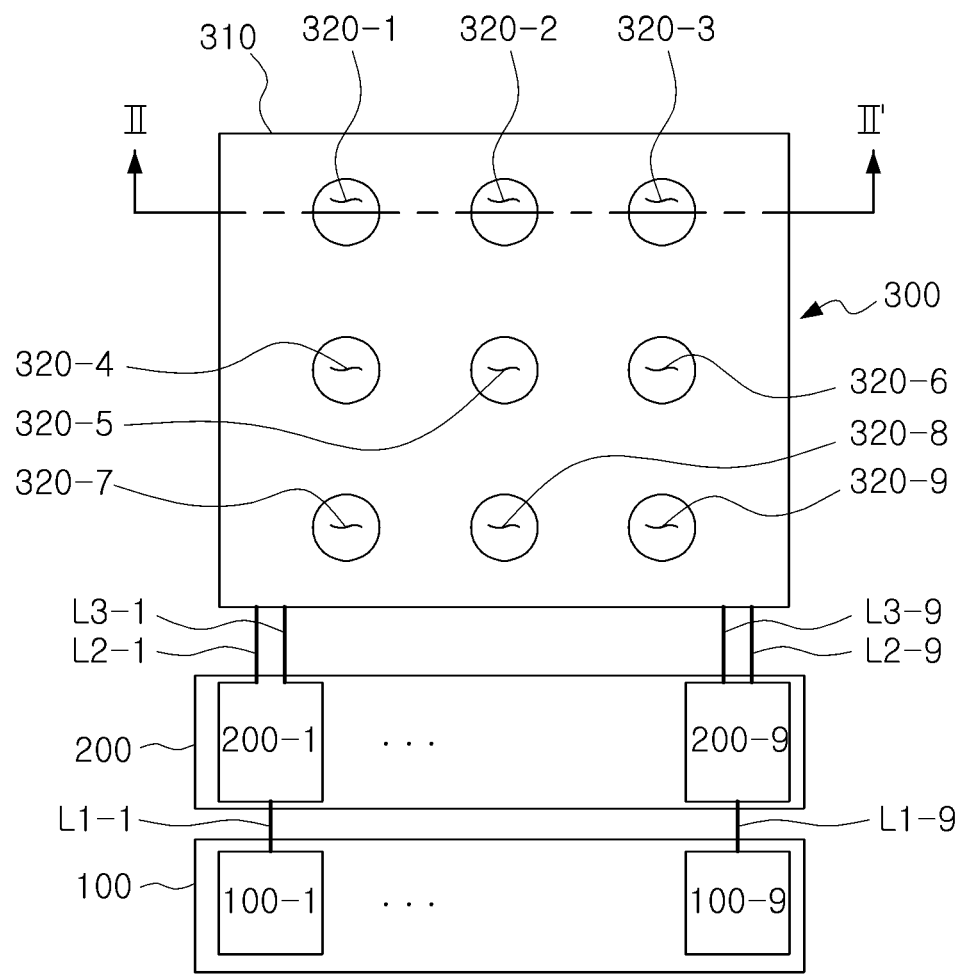
FIG. 4 is a plan view of a chemical liquid tank viewed in a direction I of FIG. 1.

Referring back to FIGS. 1 and 2, the chemical liquid tank 300 may temporarily store the chemical liquid supplied from the chemical liquid circulation apparatus 200 and provide the chemical liquid so that the chemical liquid dispensing apparatus 500 may remove the chemical liquid therefrom using suction (also referred to as "drawing" the chemical liquid therefrom). Referring to FIG. 4, an opening 320 in which a chemical liquid is stored may be disposed in the chemical liquid tank 300. At least one opening 320 may be disposed in one chemical liquid tank 300. According to an embodiment, a plurality of chemical liquid tanks 300 may be arranged as a group. The number of openings 320 disposed in one chemical liquid tank 300 may be provided to correspond to the number of chemical liquid circulation apparatuses 200. However, the present inventive concept is not limited thereto, and one chemical liquid circulation apparatus 200 may be disposed in the plurality of openings 320. The chemical liquid dispensing apparatus 500 may be disposed in a number corresponding to the plurality of openings 320, but the present inventive concept is not limited thereto. The chemical liquid dispensing apparatus 500 may be provided in a number smaller than the number of openings 320. When a plurality of chemical liquid dispensing apparatuses 500 are arranged, the plurality of chemical liquid dispensing apparatuses 500 may suction the chemical liquid stored in separate openings 320, respectively.

In a case in which a plurality of openings 320 are disposed in the chemical liquid tank 300 and a plurality of chemical liquid circulation apparatuses 200 are provided, at least two of the plurality of chemical liquid circulation apparatuses 200 may supply chemical liquids which are the same in at least a portion to the plurality of openings 320, respectively. In addition, at least two of the plurality of chemical liquid circulation apparatuses 200 may supply different types of chemical liquids to the plurality of openings 320, respectively.

In an embodiment, a plurality of openings 320 are disposed in the chemical liquid tank 300 and the plurality of openings 200 are connected to separate chemical liquid circulation apparatuses 200, respectively, as will be described below.

Referring to FIG. 4, when viewed from above, first to ninth openings 320-1 to 320-9 may be arranged in a body 310 of the chemical liquid tank 300. First to ninth chemical liquid circulation apparatuses 200-1 to 200-9 may be connected to the first to ninth openings 320-1 to 320-9, respectively. In addition, first to ninth chemical liquid supply sources 100-1 to 100-9 may be disposed in the first to ninth chemical liquid circulation apparatuses 200-1 to 200-9, respectively. Hereinafter, the first to third openings 320 will be described with reference to FIG. 5. Since the configuration of the fourth to ninth openings 320-4 to 320-9 is the same as that of the first to third openings 320-1 to 320-3, descriptions of the fourth to ninth openings 320-4 to 320-9 will be omitted.

Figure 5:
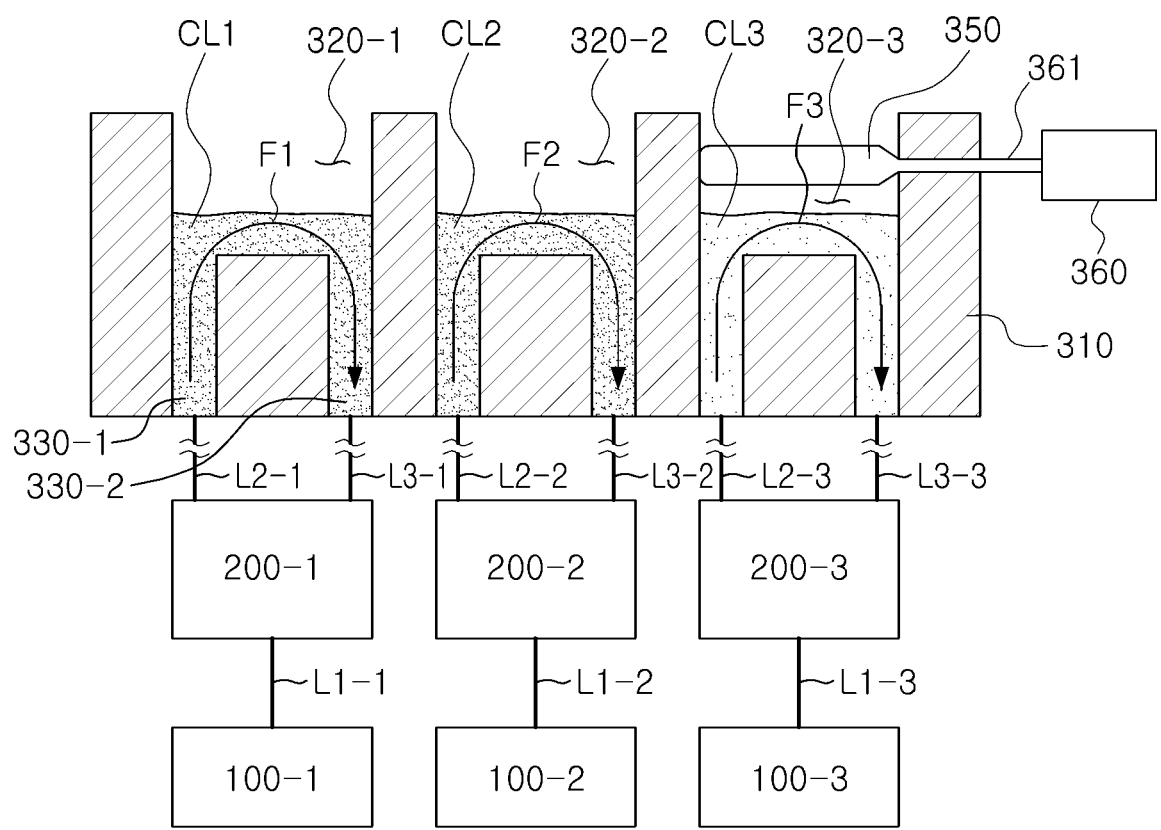
FIG. 5 is a cross-sectional view taken along line II-II' of FIG. 4.

Referring to FIG. 5, the first to third openings 320-1 to 320-3 have an inlet 330-1 and an outlet 330-2, respectively, to receive first to third chemical liquids CL1 to CL3 from the first to third chemical liquid circulation apparatuses 200-1 to 200-3 through second flow paths L2-1 to L2-3. The first to third chemical liquids CL1 to CL3 may be stored in the first to third openings 320-1 to 32-3, respectively, and may then be drawn through the chemical liquid dispensing apparatus 500.

In addition, the first to third chemical liquids CL1 to CL3 that have been stored in the first to third openings 320-1 to 320-3 may flow out to the first to third chemical liquid circulation apparatus 200-1 to 200-3 through third flow paths L3-1 and L3-3.

Accordingly, after being temporarily stored in the first to third openings 320-1 to 320-3, the first to third chemical liquids CL1 to CL3 may be collected by the first to third chemical liquid circulation apparatuses 200-1 to 200-3, having a continuous circulation flow F1 to F3.

According to an embodiment, a cover portion 350 may be disposed in at least one opening 320. In the illustrated embodiment, the cover portion 350 is disposed in the third opening 320-3. The cover portion 350 may cover the opening 320 to block the chemical liquid CL from external moisture or oxygen. In addition, after the cover portion 350 covers the opening 320, the opening 320 may be filled with a gas such as a nitrogen gas to more effectively block the chemical liquid CL from contacting external moisture or oxygen. In an embodiment, the cover portion 350 may be configured as a balloon that expands or contracts by a liquid or gas supplied from a pressure supply source 360 through a supply pipe 361. The cover portion 350 may be formed of an elastic material. For example, the cover portion 350 may be formed by thermoforming a material such as a perfluoroelastomer material (FFKM). However, the present inventive concept is not limited thereto and the cover unit 350 may have various structures such as an aperture structure and a shutter structure.

Figure 6A:
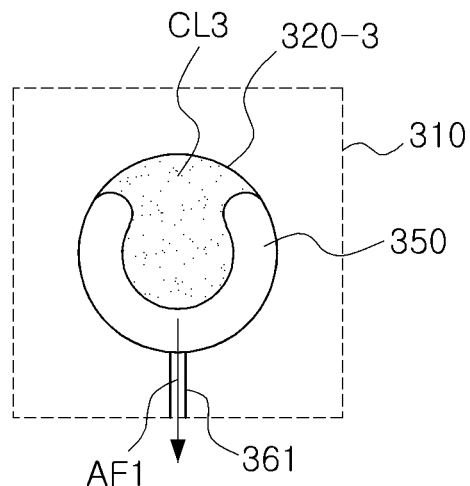
FIGS. 6A through 7B are views illustrating an operation of a cover portion of FIG. 5.

An operation of the cover portion 350 will be described with reference to FIGS. 6A through 7B. FIGS. 6A and 7A are top views of the cover portion 350, and FIGS. 6B and 7B are cross-sectional views of the cover portion 350.

Figure 6B:
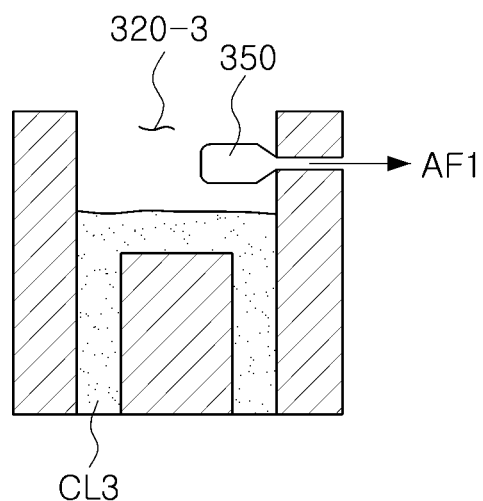
Figure 7A:
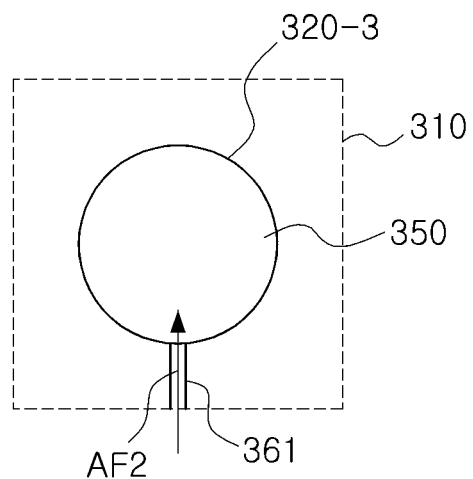

Referring to FIGS. 6A and 6B, when a liquid or gas filling the inside of the cover portion 350 is discharged through the supply pipe 361 (AF1), the cover portion 350 may contract and the chemical liquid CL3 stored below the cover portion 350 may be exposed. Accordingly, the chemical liquid CL3 may be drawn through the chemical liquid dispensing apparatus 500 of FIG. 1.

Figure 7B:
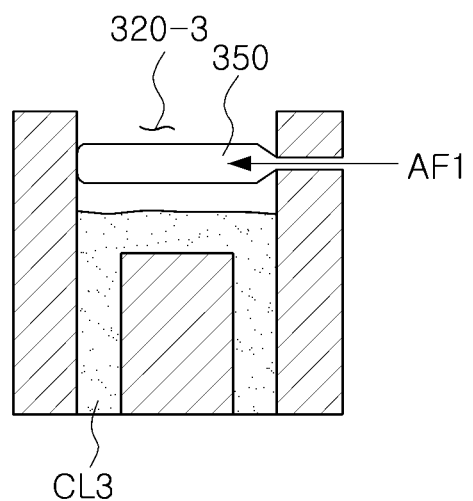

Referring to FIGS. 7A and 7B, when a liquid or gas is supplied to the inside of the cover portion 350 through the supply pipe 361 (AF2), the cover portion 350 may expand to cover the opening 320-3.

Figure 8A:
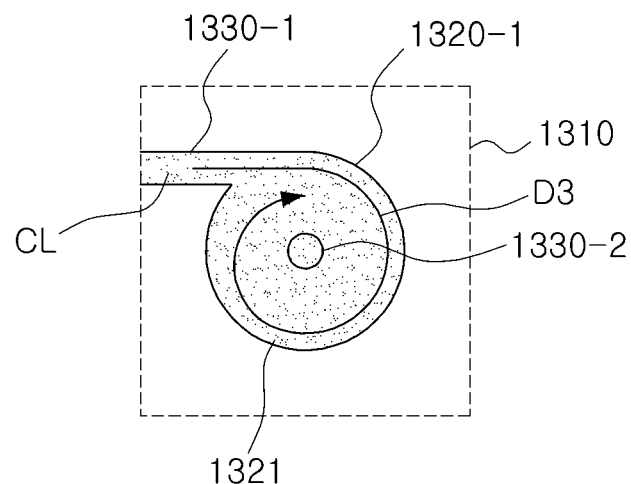
FIGS. 8A and 8B are modifications of an opening of FIG. 5.

A shape of the opening may vary. For example, a modification of the opening will be described with reference to FIGS. 8A and 8B. FIG. 8A is a top view of the opening and FIG. 8B is a cross-sectional view of the opening.

Figure 8B:
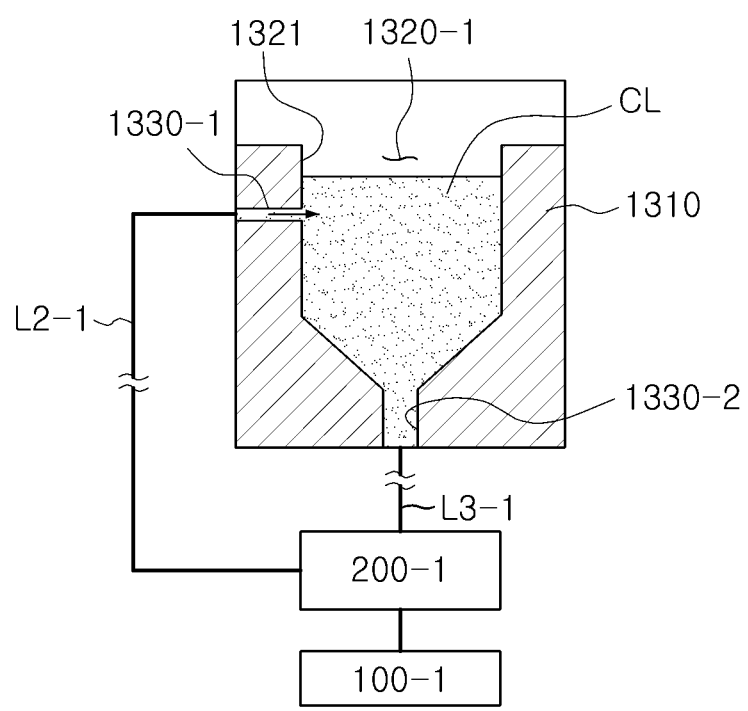

In the embodiment described above, the inlet and outlet are disposed on the bottom of the opening, whereas, in the illustrated embodiment of FIGS. 8A and 8B, an inlet 1330-1 is disposed on a side wall of an opening 1330-1 and an outlet 1330-2 is disposed on the bottom of the opening 1320-1. In an embodiment, the chemical liquid CL introduced through the inlet 1330-1 may rotate in a clockwise direction D3 along the side wall 1321 to naturally form a vortex. In the illustrated embodiment, the inlet 1330-1 is disposed on one side of the side wall 1321 so that the chemical liquid CL introduced through the inlet 1330-1 rotates in the clockwise direction D3, but is limited thereto. According to an embodiment, the inlet may be disposed on the other side of the side wall 1321 so that the chemical liquid CL may rotate in a counterclockwise direction.

The chemical liquid dispensing apparatus 500 will be described with reference to FIGS. 1 through 9.

Referring to FIG. 1, the chemical liquid dispensing apparatus 500 may draw a chemical liquid stored in the chemical liquid tank 300, temporarily store the drawn chemical liquid, move onto the wafer W, a target substrate, and discharge the temporarily stored chemical liquid CL onto the wafer W. A plurality of chemical liquid dispensing apparatuses 500 may be provided. The plurality of chemical liquid dispensing apparatuses 500 may draw different types of chemical liquids CL stored in different openings and then discharge the suctioned chemical liquids onto the wafer W, respectively. In addition, in a case in which it is necessary to discharge a chemical liquid in an amount exceeding the amount that may be drawn by one chemical liquid dispensing apparatus 500, the plurality of chemical liquid dispensing apparatuses 500 may simultaneously draw the same kind of chemical liquid CL stored in different openings and then sequentially discharge the drawn chemical liquids CL onto the wafer W. Referring to FIGS. 1 through 9, the chemical liquid dispensing apparatus 500 may include an arm 510 configured to move back and forth and left and right, a syringe portion 520 connected to the arm 510 and having an internal space 522, a syringe pump 525 disposed in the internal space 522 of the syringe portion 520, a nozzle portion 550 fastened to the syringe portion 520, a cleaning liquid valve unit 530, and a camera unit 540. The camera unit 540 may be omitted according to an embodiment.

The syringe portion 520 is a body connected to the arm 510 and configured to move up and down and left and right. The syringe portion 520 may have the internal space 522, and the syringe pump 525 may be disposed in the internal space 522 to adjust pressure of the internal space 522. In an embodiment, the syringe pump 525 may be a diaphragm valve that moves a diaphragm 524 back and forth. The syringe pump 525 may move back and forth to open and close a cleaning liquid supply flow path 521. In addition, the syringe pump 525 may move back and forth to change a volume of the internal space 522 to adjust pressure of the internal space 522. The nozzle portion 550 communicates with the internal space 522 of the syringe portion 520 through a syringe flow path 523, and the chemical liquid CL may be drawn into or discharged through a flow path 551 according to a change in pressure of the internal space 522. Here, an amount of the chemical liquid CL discharged through the nozzle portion 550 is controlled to be less than an amount of the drawn chemical liquid CL to prevent a splash phenomenon in which the last part of the discharged chemical liquid CL falls dropwise (i.e., as droplets of liquid).

The nozzle portion 550 may be formed of a light-transmissive material so that the chemical liquid CL drawn into or discharged from the flow path 551 may be visually recognized through the light-transmissive material. The nozzle portion 550 may include a conductive material such as a carbon nano-tube and carbon black. In this case, a ground electrode 527 electrically connected to the nozzle portion 550 may be disposed in the syringe portion 520 to remove static electricity accumulated in the nozzle portion 550 in the process of drawing or discharging the chemical liquid CL.

According to an embodiment, the chemical liquid dispensing apparatus 500 may include a camera unit 540 configured to acquire images of a liquid level LL of the chemical liquid CL drawn into or discharged from the nozzle portion 550 and to transmit the images of the liquid level to the controller 700. The camera unit 540 may be disposed below the syringe portion 520 to facilitate imaging of the nozzle portion 550. However, the present inventive concept is not limited thereto, and according to embodiments, the camera unit 540 may be disposed separately from the syringe portion 520. The camera unit 540 may be disposed to have an angle of view PA to image the nozzle portion 550 as a whole and may be set to focus on the flow path 551 of the nozzle portion 550 to precisely image the liquid level LL of the chemical liquid CL drawn into the nozzle portion 550. In addition, the camera unit 540 may image a process in which the chemical liquid CL drawn into the nozzle portion 550 is discharged. The camera unit 540 may include a CCD or CMOS image sensor.

The camera unit 540 may generate an image of the liquid level LL of the chemical liquid CL suctioned or discharged through the nozzle portion 550 and transmit the generated image to the controller 700 illustrated in FIG. 2. The controller 700 may analyze an image captured by the camera unit 540 to identify whether the chemical liquid CL has been drawn at a preset reference level. In addition, the controller 700 may calculate a volume of the drawn chemical liquid CL based on the liquid level LL of the imaged chemical liquid CL and previously stored data. In addition, the controller 700 may analyze the image captured by the camera unit 540 to determine whether the chemical liquid CL is normally discharged.

Figure 9:
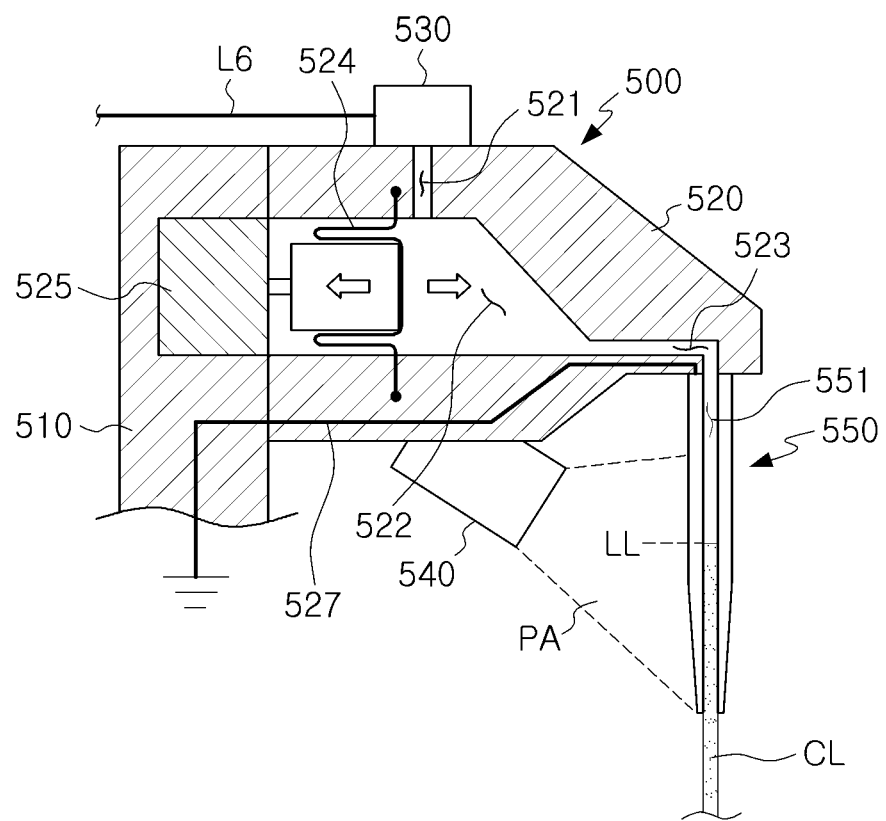
FIG. 9 is an enlarged view of a chemical liquid dispensing apparatus of FIG. 1.

The cleaning liquid valve unit 530 may be attached to the nozzle portion 550 to supply a cleaning liquid to the internal space 522 of the syringe portion 520 through the cleaning liquid supply flow path 521. The cleaning liquid valve unit 530 may be connected to a cleaning liquid supply source 420 through a sixth flow path L6 to receive the cleaning liquid (FIG. 9). The cleaning liquid supplied to the internal space 522 through the cleaning liquid valve unit 530 may be pressurized by the syringe pump 525 so as to be discharged through the nozzle portion 550, and during this process, the flow path 551 of the nozzle portion 550 may be cleaned.

A process of discharging the chemical liquid CL, which has been drawn into the chemical liquid dispensing apparatus 500, to the wafer W will be described with reference to FIGS. 10A and 10B.

Figure 10A:
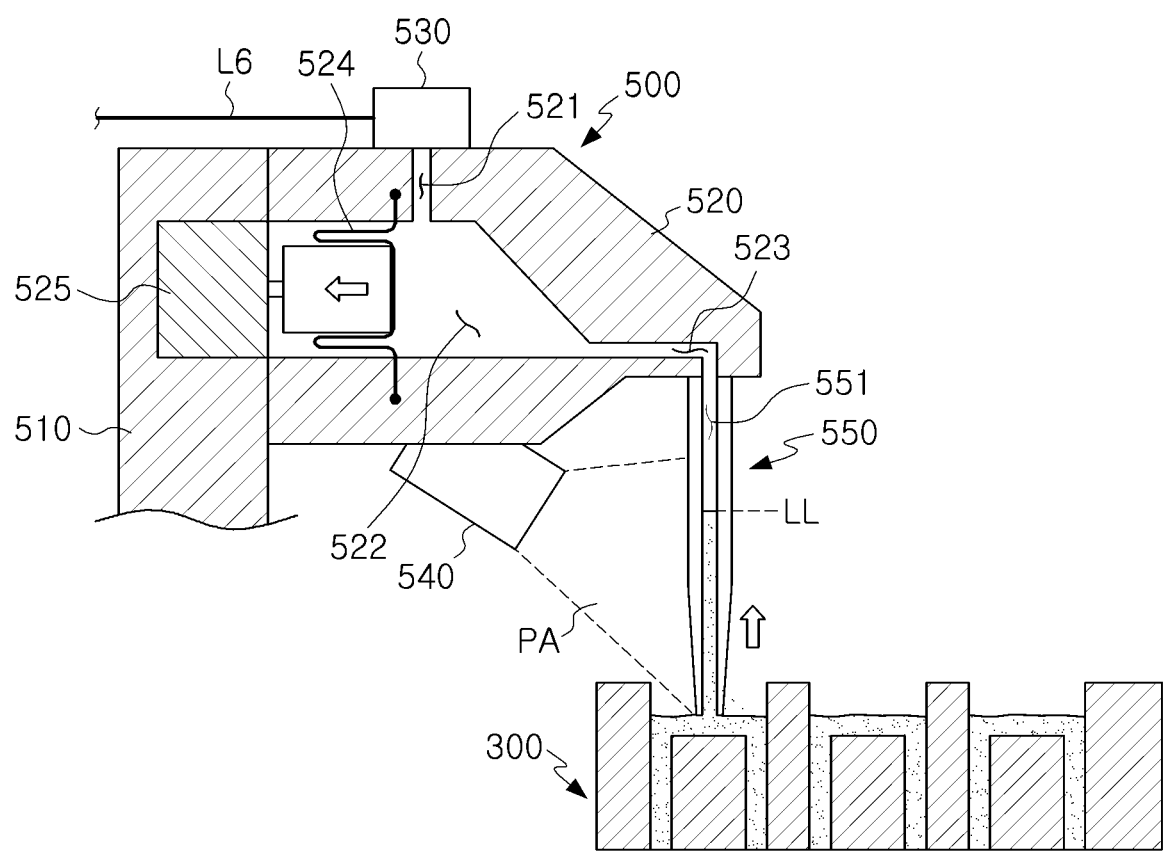
FIGS. 10A and 10B are views illustrating a dispensing process of the chemical liquid dispensing apparatus of FIG. 9.

Referring to FIG. 10A, the chemical liquid dispensing apparatus 500 may retract the syringe pump 525 to form a negative pressure state within the internal space 522 with reduced pressure. When the internal space 522 is in the negative pressure state, air in the flow path 551 of the nozzle portion 550 may be drawn through the syringe flow path 523, so that the chemical liquid CL may be drawn from the chemical liquid tank 300. According to an embodiment, the camera unit 540 may capture an image of the liquid level LL of the chemical liquid CL drawn into the nozzle portion 550 and transmit the captured image to the controller 700 of FIG. 2. The camera unit 540 may continuously perform imaging while the chemical liquid CL is drawn into the nozzle portion 550. The controller 700 may calculate a volume value of the chemical liquid CL drawn into the nozzle portion 550 in real time based on the image transmitted from the camera unit 540 and compare the calculated volume value with a reference value. When the calculated volume value is equal to the reference value, the controller 700 may stop the operation of the syringe pump 525 so that the chemical liquid CL of the reference value may be drawn into the nozzle portion 550.

Figure 10B:
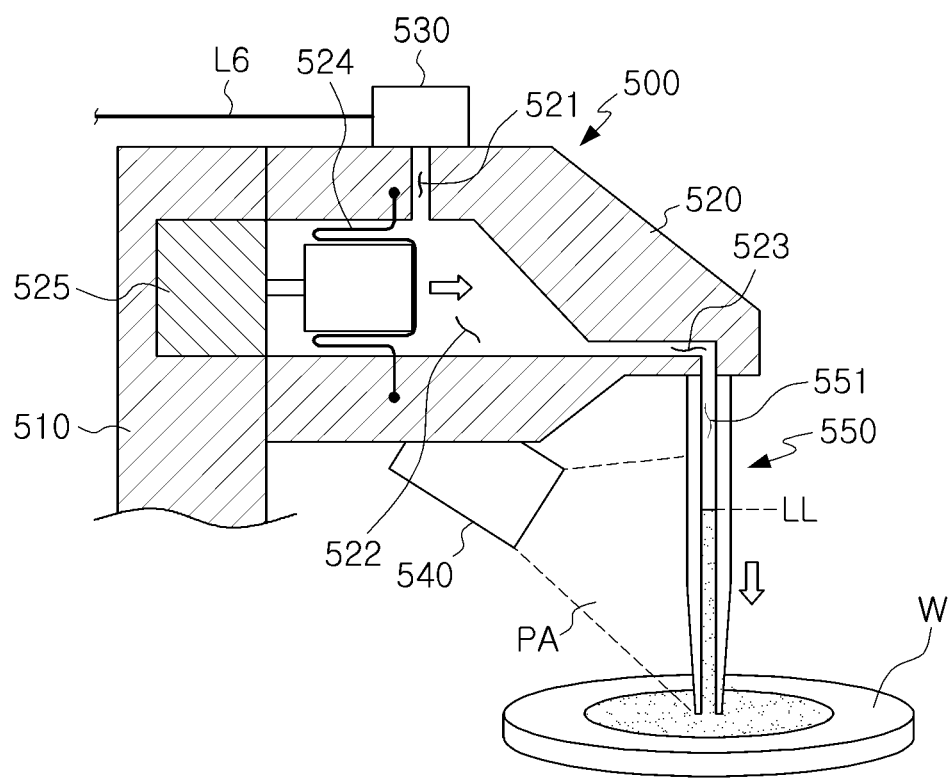

Referring to FIG. 10B, the chemical liquid dispensing apparatus 500 may advance the syringe pump 525 to pressurize the internal space 522, thereby discharging the chemical liquid CL drawn into the nozzle portion 550. According to an embodiment, the camera unit 540 may capture an image of the liquid level LL of the chemical liquid CL discharged from the nozzle portion 550 and transmit the captured image to the controller 770 of FIG. 2. The camera unit 540 may continuously perform imaging, while the chemical liquid CL is being discharged to the nozzle portion 550. The controller 700 may determine whether the liquid level LL of the chemical liquid CL is decreasing based on the image transmitted from the camera unit 540 to determine whether the chemical liquid CL is normally discharged from the nozzle portion 550.

Referring back to FIG. 1, the cleaning apparatus 400 may include a body portion 410, a cleaning liquid supply source 420 connected to the body portion 410, and a drying gas supply source 430.

Figure 11:
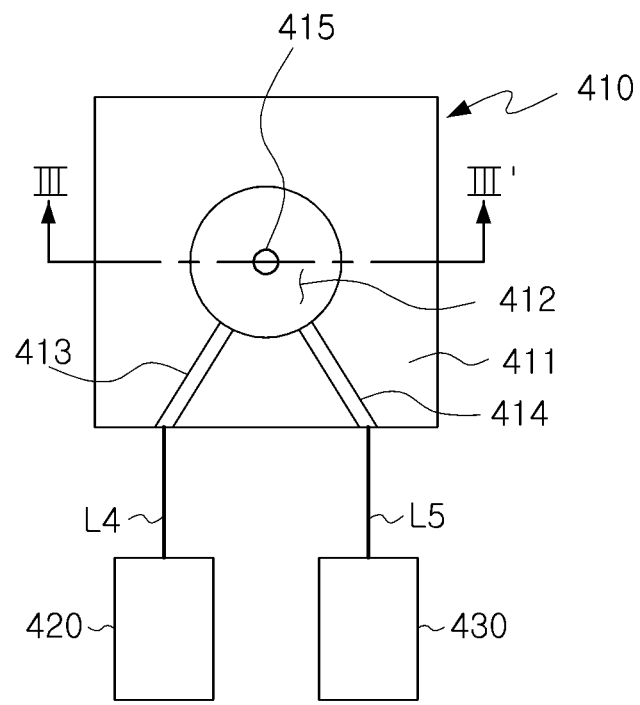
FIG. 11 is a plan view of a cleaning apparatus of FIG. 1.
Figure 12:
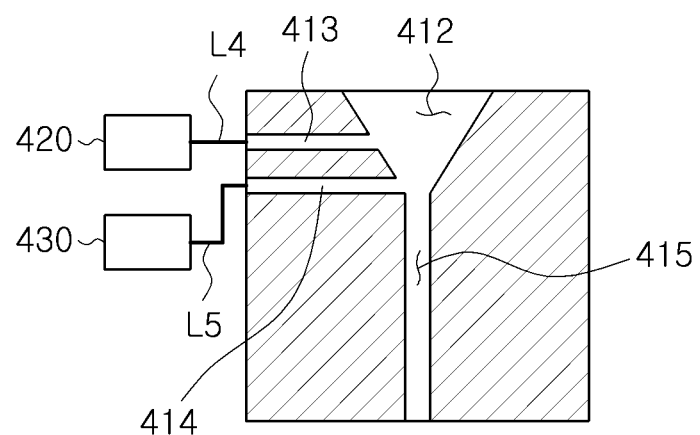
FIG. 12 is a cross-sectional view taken along line III-III' of FIG. 11.

Referring to FIGS. 11 and 12, when viewed from above, the body portion 410 may have at least one cleaning opening 412. The cleaning opening 412 may be arranged in a number corresponding to the nozzle portion 550 of the chemical liquid dispensing apparatus 500. That is, when a plurality of chemical liquid dispensing apparatuses 500 are provided, a corresponding plurality of cleaning openings 412 of the cleaning apparatus 400 are also provided. A cleaning liquid supply pipe 413 and a drying gas supply pipe 414 connected to the cleaning opening 412 may be disposed in the body portion 410. The cleaning liquid supply pipe 413 may be connected to the cleaning liquid supply source 420 through a fourth flow path L4. The drying gas supply pipe 414 may be connected to the drying gas supply source 430 through a fifth flow path L5. A drain flow path 415 may be disposed in the cleaning opening 412.

The cleaning opening 412, a space into which the nozzle portion 550 is inserted to clean and dry the outside of the nozzle portion 550, may have an inclined side surface so that the cleaning liquid and a drying gas may be easily discharged to the drain flow path 415.

An operation of the cleaning apparatus 400 will be described with reference to FIGS. 13 and 14.

Figure 13:
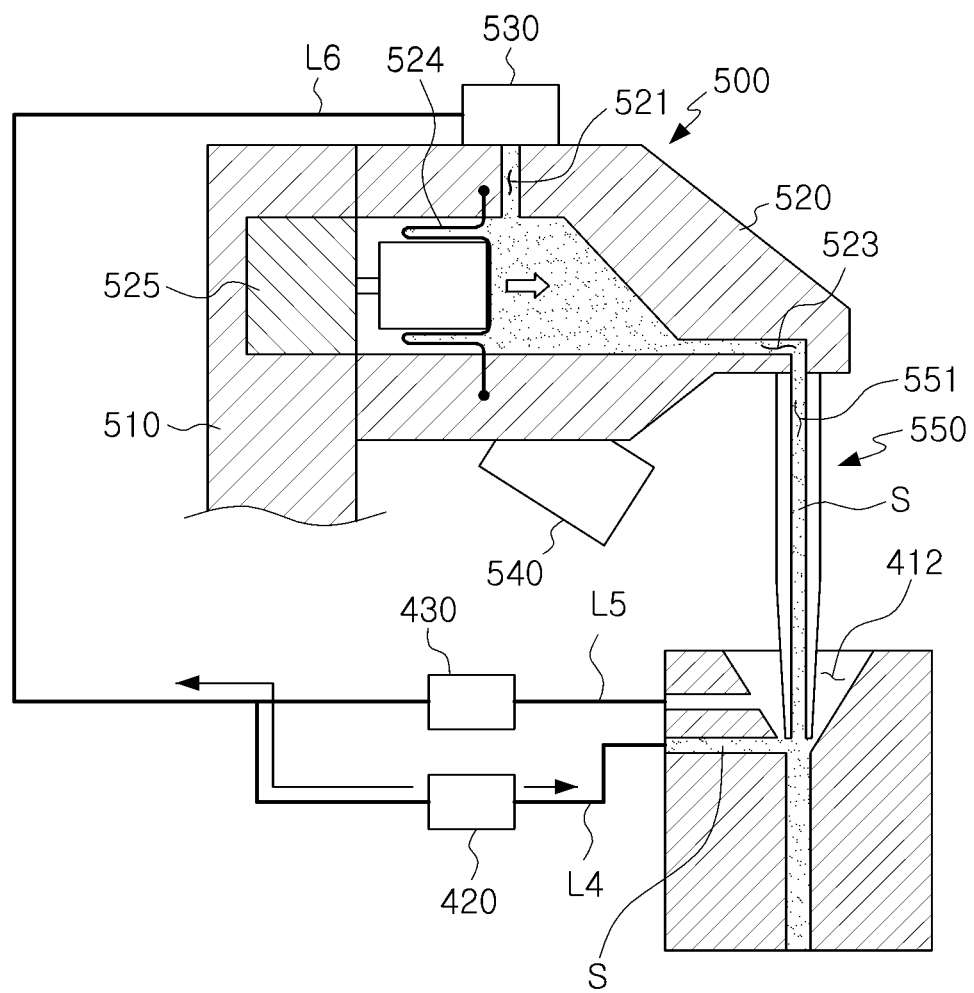
FIGS. 13 and 14 are views illustrating a process of cleaning a chemical liquid dispensing apparatus through a cleaning apparatus.

Referring to FIG. 13, first, the nozzle portion 550 may be cleaned. That is, when the nozzle portion 550 is inserted into the cleaning opening 412, a cleaning liquid S from the cleaning liquid supply source 420 may be supplied through the cleaning liquid valve unit 530 to clean the flow path 551 of the nozzle portion 550, and the cleaning liquid S may be supplied to the cleaning opening 412 through the fourth flow path L4, so that the outside of the nozzle portion 550 may be cleaned. However, according to an embodiment, a drying gas DG may be mixed with the cleaning liquid S and supplied. That is, in the case of cleaning the nozzle portion 550, the drying gas DG may be supplied together with the cleaning liquid S to improve a cleaning effect.

Figure 14:
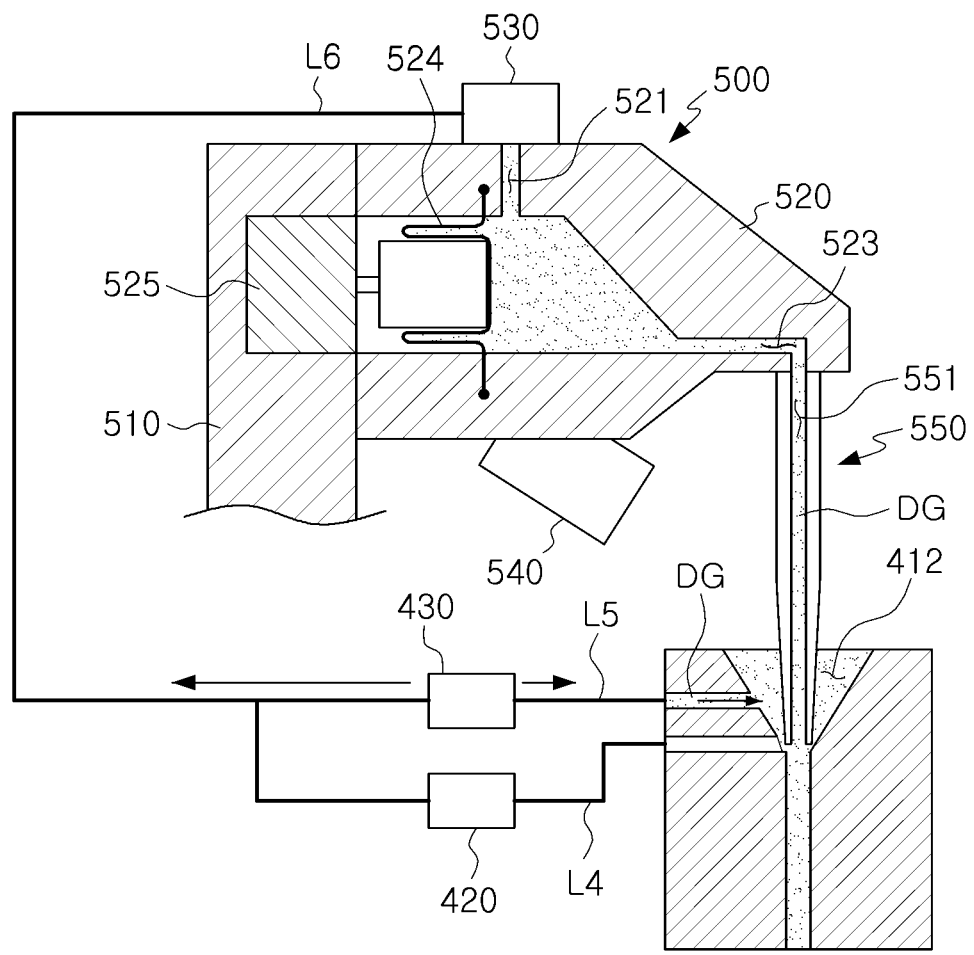

Next, referring to FIG. 14, the nozzle portion 550 may be dried. That is, after the flow path 551 and the outside of the nozzle portion 550 are cleaned, the drying gas DG from the drying gas supply source 430 may be supplied through the cleaning liquid valve unit 530 to dry the flow path 551 of the nozzle portion 550 and the drying gas DG may be supplied to the cleaning opening 412 through the fifth flow path L5 to dry the outside of the nozzle portion 550.

Next, an operation of the chemical liquid supply system of an embodiment will be described with reference to FIGS. 1, 10A, 10B, and 17.

Figure 17:
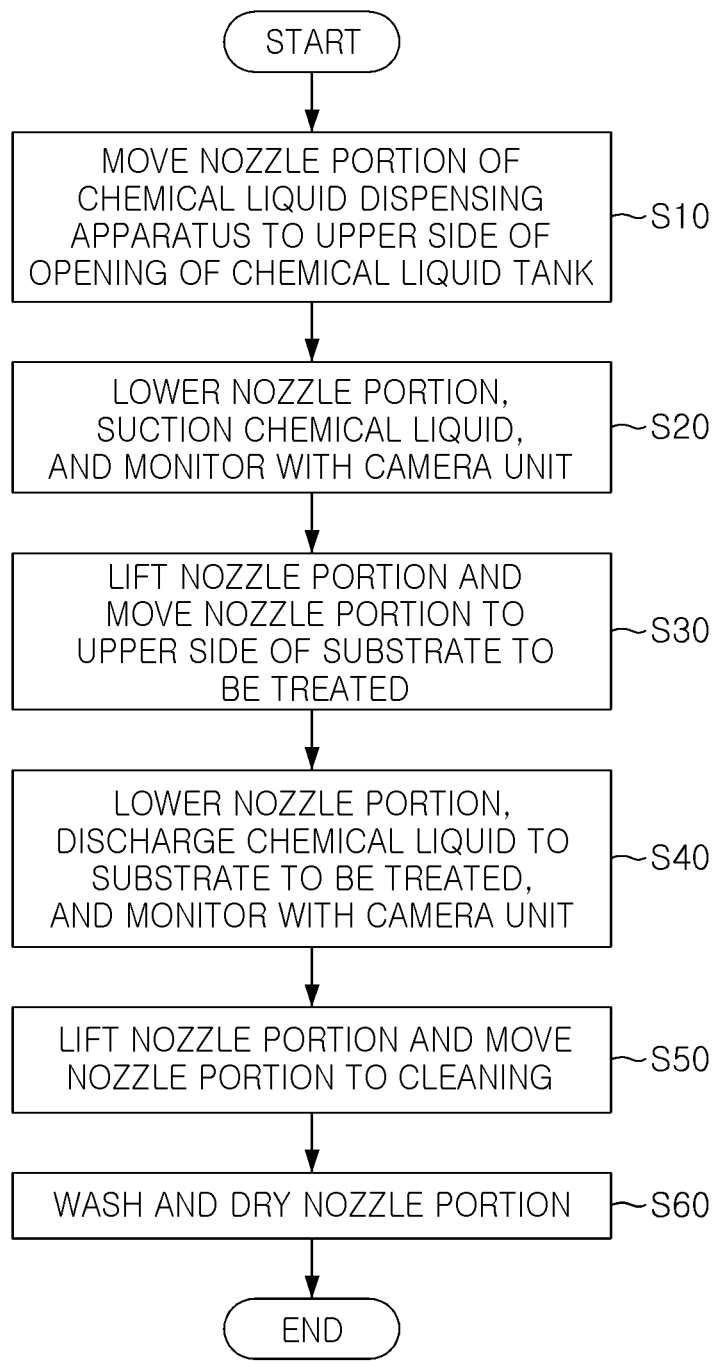
FIG. 17 is a flow chart illustrating an operation of a chemical liquid supply system according to an embodiment of the present inventive concept.

First, referring to FIGS. 1 and 17, the nozzle portion 550 of the chemical liquid dispensing apparatus 500 may be moved to an upper side of the opening 320 (i.e., above the opening 320) of the chemical liquid tank 300 in operation S10.

Next, referring to FIGS. 10A and 17, the nozzle portion 550 may be lowered to draw the chemical liquid CL stored in the chemical liquid tank 300 therefrom, and a liquid level LL of the chemical liquid CL drawn into the nozzle portion 550 may be monitored through the camera unit 540 in operation S20.

Next, referring to FIGS. 1 and 17, the nozzle portion 550 may be lifted and subsequently moved above the wafer W, a substrate to be treated in operation S30.

Next, referring to FIGS. 10B and 17, the nozzle portion 550 is lowered from above the wafer W and discharges the chemical liquid CL to a surface of the wafer W, and a liquid level LL of the discharged chemical liquid CL may be monitored through the camera unit 540 in operation S40.

Next, referring to FIGS. 1 and 17, the nozzle portion 550 may be lifted and moved to the cleaning apparatus 400 in operation S50.

Next, referring to FIGS. 1 and 17, the nozzle portion 550 may be cleaned and dried in operation S60.

The chemical liquid circulation apparatus according to the technical idea of the present inventive concept may increase cleanliness of the chemical liquid by repeatedly circulating the chemical liquid.

The chemical liquid dispensing apparatus according to the technical idea of the present inventive concept may be separated from the chemical liquid circulation apparatus, so that the chemical liquid circulation apparatus may continuously maintain the circulation of the chemical liquid.

The chemical liquid supply system according to the technical idea of the present inventive concept may provide a chemical liquid with high cleanliness to a supplied substrate.

While example embodiments have been shown and described above, it will be apparent to those skilled in the art that modifications and variations could be made without departing from the scope of the present inventive concept as defined by the appended claims.

What is claimed is:

1. A chemical liquid supply system comprising:
    a chemical liquid tank comprising an inlet, an outlet, and an external opening between the inlet and the outlet, wherein the inlet is connected to one portion of the external opening, and the outlet is connected to another portion of the external opening, wherein the external opening is configured to receive a chemical liquid introduced through the inlet and temporarily store a volume of the chemical liquid upstream from the outlet, and wherein the volume of the chemical liquid within the opening is exposed to an environment external to the tank, external to the inlet, and external to the outlet;
    a chemical liquid supply source configured to supply the chemical liquid to the chemical liquid circulation apparatus; and
    a chemical liquid dispensing apparatus configured to move to the external opening of the chemical liquid tank, draw the chemical liquid from the external opening, move to a substrate to be treated and discharge the drawn chemical liquid onto the substrate.

2. The chemical liquid supply system of claim 1, wherein the chemical liquid circulation apparatus is in fluid communication with the chemical liquid tank to form a circulation flow path.

3. The chemical liquid supply system of claim 1, wherein the chemical liquid circulation apparatus further comprises:
    a circulation pump configured to pressurize the chemical liquid supplied to the inlet of the chemical liquid tank;
    a filter disposed at a rear end of the circulation pump and in fluid communication with the inlet of the chemical liquid tank, wherein the filter is configured to filter out particles contained in the chemical liquid; and
    a chemical liquid storage unit in fluid communication with the inlet of the chemical liquid tank and the outlet of the chemical liquid tank.

4. The chemical liquid supply system of claim 3, wherein the circulation pump is a magnetic levitation pump.

5. The chemical liquid supply system of claim 1, wherein the chemical liquid circulation apparatus comprises a plurality of chemical liquid circulation apparatuses, and
    the chemical liquid tank comprises a respective plurality of external openings, each of the plurality of external openings configured to temporarily store the chemical liquid for a respective one of the plurality of chemical liquid circulation apparatuses.

6. The chemical liquid supply system of claim 5, wherein at least two of the plurality of chemical liquid circulation apparatuses supply chemical liquids which are the same to the plurality of external openings or supply different types of chemical liquids to the plurality of external openings.

7. The chemical liquid supply system of claim 6, wherein the chemical liquid dispensing apparatus comprises a plurality of chemical liquid dispensing apparatuses, and
    wherein each chemical liquid dispensing apparatus is configured to draw a respective one of the chemical liquids from a respective one of the plurality of external openings.

8. The chemical liquid supply system of claim 1, wherein the chemical liquid dispensing apparatus comprises:
    an arm;
    a syringe portion movably connected to the arm, wherein the syringe portion comprises an internal space;
    a syringe pump configured to adjust pressure within the internal space of the syringe portion;
    a nozzle portion in fluid communication with the syringe portion and configured to draw the chemical liquid therein and discharge the chemical liquid therefrom in response to operation of the syringe pump; and
    a cleaning liquid valve unit in fluid communication with the syringe portion and configured to supply a cleaning liquid to the internal space.

9. The chemical liquid supply system of claim 8, wherein the chemical liquid dispensing apparatus further comprises a camera configured to acquire images of a liquid level of the chemical liquid drawn into the nozzle portion and a liquid level of the chemical liquid discharged from the nozzle portion.

10. The chemical liquid supply system of claim 9, wherein the nozzle portion comprises a light-transmissive material, and wherein the camera is configured to acquire the images through the light-transmissive material.

11. The chemical liquid supply system of claim 10, wherein the nozzle portion comprises a conductive material, and wherein the syringe portion comprises a ground electrode connected to the nozzle portion.

12. The chemical liquid supply system of claim 11, wherein the conductive material comprises at least one of carbon nano-tube and carbon black.

13. The chemical liquid supply system of claim 8, wherein the syringe pump is configured to adjust the pressure within the internal space so that an amount of the chemical liquid drawn into the nozzle portion is greater than an amount of the chemical liquid subsequently discharged through the nozzle portion.

14. The chemical liquid supply system of claim 8, further comprising:
    a cleaning apparatus configured to clean the nozzle portion,
    wherein the cleaning apparatus comprises:
        a body portion comprising a cleaning opening in which the nozzle portion is inserted;
        a cleaning liquid supply source configured to supply a cleaning liquid to the cleaning opening; and
        a drying gas supply source configured to supply a drying gas to the cleaning opening.

15. The chemical liquid supply system of claim 14, wherein the cleaning apparatus is configured to sequentially supply the cleaning liquid and the drying gas to the cleaning opening and/or mix the cleaning liquid and the drying gas and supply a mixture thereof to the cleaning opening.

16. The chemical liquid supply system of claim 1, wherein the chemical liquid tank further comprises a cover portion comprising an elastic material that is configured to expand and contract, and wherein the cover portion is configured to cover the external opening when in an expanded configuration and provide access to the external opening when in a contracted configuration.

17. The chemical liquid supply system of claim 16, wherein the cover portion comprises:
   a balloon configured to expand and contract in response to a change in internal pressure therein; and
   a pressure supply source configured to supply and remove a liquid or a gas to or from the balloon to adjust the internal pressure of the balloon.

18. The chemical liquid supply system of claim 1, wherein the inlet and the outlet are located on a bottom portion of the external opening, and wherein the chemical liquid flows up from the inlet, over a structure within the external opening, and down through the outlet.

19. The chemical liquid supply system of claim 1, wherein the inlet is located on a side wall of the external opening and the outlet is located on a bottom portion of the external opening, and wherein the continuous flow of the chemical liquid in the external opening forms a vortex.

20. A chemical liquid supply system comprising:
   a chemical liquid tank comprising an inlet, an opening configured to store a chemical liquid introduced through the inlet, an outlet, and a cover portion comprising an elastic material that is configured to expand and contract, wherein the cover portion is configured to cover the opening when in an expanded configuration and provide access to the opening when in a contracted configuration, and wherein the cover portion comprises:
      a balloon configured to expand and contract in response to a change in internal pressure therein; and
      a pressure supply source configured to supply and remove a liquid or a gas to or from the balloon to adjust the internal pressure of the balloon;
   a chemical liquid circulation apparatus configured to supply the chemical liquid to the inlet of the chemical liquid tank and to collect the chemical liquid from the outlet of the chemical liquid tank;
   a chemical liquid supply source configured to supply the chemical liquid to the chemical liquid circulation apparatus; and
   a chemical liquid dispensing apparatus configured to move to the opening of the chemical liquid tank, draw the chemical liquid from the opening, move to a substrate to be treated and discharge the drawn chemical liquid onto the substrate.

* * * * *